US006187685B1

(12) United States Patent
Hopkins et al.

(10) Patent No.: US 6,187,685 B1
(45) Date of Patent: Feb. 13, 2001

(54) METHOD AND APPARATUS FOR ETCHING A SUBSTRATE

(75) Inventors: Janet Hopkins, Powys; Ian Ronald Johnston, Cardiff; Jyoti Kiron Bhardwaj, Bristol; Huma Ashraf, Newport; Alan Michael Hynes, Cardiff; Leslie Michael Lea, Oxfordshire, all of (GB)

(73) Assignee: Surface Technology Systems Limited, Newport (GB)

( * ) Notice: Under 35 U.S.C. 154(b), the term of this patent shall be extended for 0 days.

(21) Appl. No.: 09/245,861

(22) Filed: Feb. 8, 1999

Related U.S. Application Data

(63) Continuation-in-part of application No. 08/904,953, filed on Aug. 1, 1997, now Pat. No. 6,051,503.

(30) Foreign Application Priority Data

Nov. 4, 1998 (GB) .................................................. 9824077
Jan. 29, 1999 (GB) .................................................. 9901867

(51) Int. Cl.[7] .................................................. H01L 21/00
(52) U.S. Cl. .......................... 438/710; 216/37; 216/59; 438/9; 438/694; 438/714; 438/719; 438/723; 156/345
(58) Field of Search .................... 438/9, 14, 694, 438/695, 705, 710, 712, 714, 718, 719, 723, 735, 743; 216/37, 59, 60, 67, 79; 156/345 MT, 345 P

(56) References Cited

U.S. PATENT DOCUMENTS 4,533,430   8/1985   Bower .
4,599,135 * 7/1986   Tsunekawa et al. ................... 216/37

(List continued on next page.)

FOREIGN PATENT DOCUMENTS

| 0 160 220 A1 | 11/1985 | (EP) . |
| 0 246 514 A2 | 11/1987 | (EP) . |
| 0 350 997 A2 | 1/1990 | (EP) . |
| 0 363 982 A2 | 4/1990 | (EP) . |
| 0 383 570 A2 | 8/1990 | (EP) . |
| 0 482 519 | 10/1991 | (EP) . |
| 0 482 519 A1 | 4/1992 | (EP) . |
| 0 536 968 A2 | 4/1993 | (EP) . |
| 0 562 464 A1 | 9/1993 | (EP) . |
| 62-136066 | 6/1987 | (JP) . |
| 3-126222 | 5/1991 | (JP) . |
| 3-129820 | 6/1991 | (JP) . |
| 6-12767 | 2/1994 | (JP) . |
| WO 89/01701 | 2/1989 | (WO) . |
| WO 94/14187 | 6/1994 | (WO) . |

OTHER PUBLICATIONS

L.M. Ephrath, "Selective Etching of Silicon Dioxide Using Reactive Ion Etching with CF4–H2", J. Electrochem. So.: Solid–State Science And Technology, Aug. 1979, pp. 1419–1421.

(List continued on next page.)

Primary Examiner—William Powell
(74) Attorney, Agent, or Firm—Jones Volentine, LLC

(57) ABSTRACT

There is disclosed a method and apparatus for etching a substrate. The method comprises the steps of etching a substrate or alternately etching and depositing a passivation layer. A bias frequency, which may be pulsed, may be applied to the substrate and may be at or below the ion plasma frequency.

19 Claims, 16 Drawing Sheets

U.S. PATENT DOCUMENTS

| | | |
|---|---|---|
| 4,635,090 | 1/1987 | Tamaki et al. . |
| 4,707,218 | 11/1987 | Giammarco et al. . |
| 4,784,720 | 11/1988 | Douglas . |
| 4,795,529 | 1/1989 | Kawasaki et al. . |
| 4,832,788 | 5/1989 | Nemiroff . |
| 4,855,017 | 8/1989 | Douglas . |
| 4,985,114 * | 1/1991 | Okudaira et al. ............... 216/37 |
| 5,068,202 | 11/1991 | Crotti et al. . |
| 5,368,685 | 11/1994 | Kumihashi et al. . |
| 5,474,650 | 12/1995 | Kumihashi et al. . |
| 5,498,312 * | 3/1996 | Laermer et al. .............. 216/37 X |
| 5,501,893 | 3/1996 | Laermer et al. . |
| 5,605,600 | 2/1997 | Muller et al. . |

OTHER PUBLICATIONS

D.W. Hess, "Plasma Etch Chemistry of Aluminum and Aluminum Alloy Films", Plasma Chemistry and Plasma Processing, vol. 2, No. 2, 1982, pp. 141–155.

K. Tsujimoto et al., "A New side Wall Protection Technique in Microwave Plasma Etching Using a Chopping Method", Extended Abstracts of the 18th Conference on Solid State Devices and Materials, Tokyo, 1986.

Patent Abstracts of Japan, Publication No. 63043321; Publication Date: Feb. 24, 1988; Inventor: Kubota Masabumi: "Dry Etching Method".

Patent Abstracts of Japan, Publication No. 07226397; Publication Date: Aug. 22, 1995; Inventor: Koshimizu Chishio: "Etching Treatment Method".

* cited by examiner

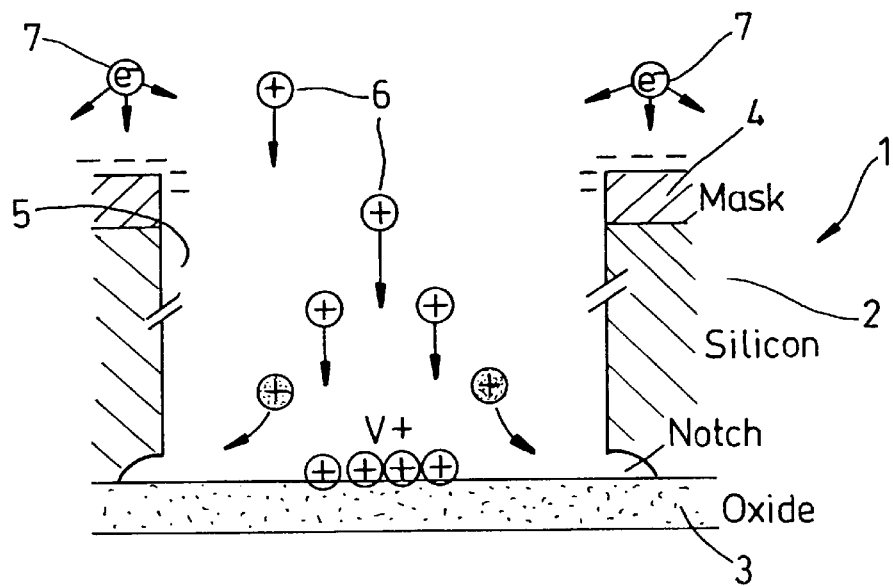
A: CW RF bias:
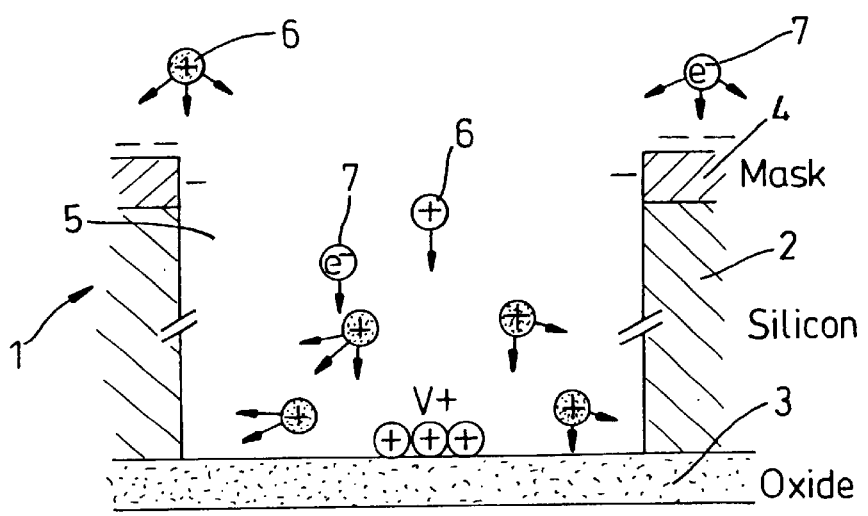
B: Pulsed RF bias off cycle (or during the off cycle in pulsed source):
*Fig. 1*

Notching of silicon at oxide interface
13.56 MHz bias frequency
step 1 only

Profile without notching, obtained by using 2 step process. 2nd step at higher pressure and higher passivation level. 13.56 MHz bias frquency.
Step 1 and step 2.

Grass formation if step 2 is used
for too great a depth. 13.56 MHz

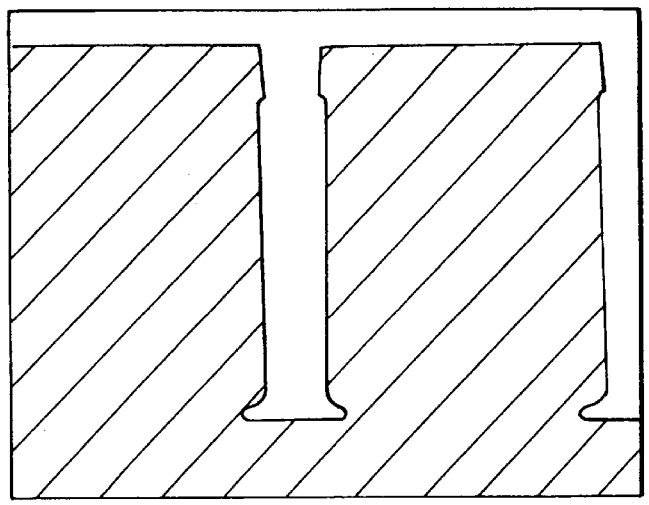
Low frequency continuous step 1 only
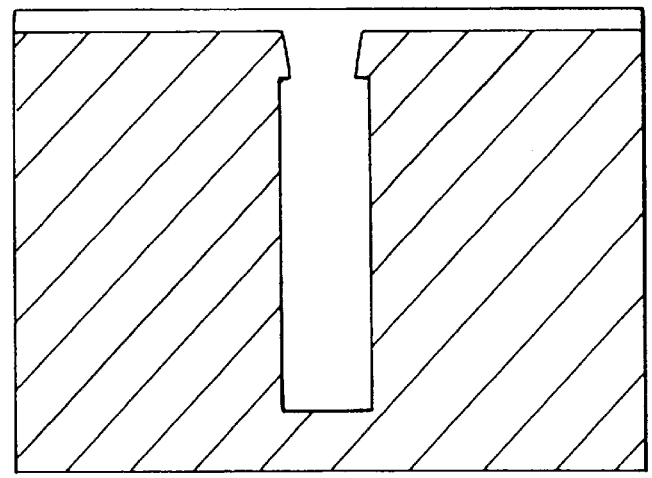
Low frequency continuous step 1 and step 2
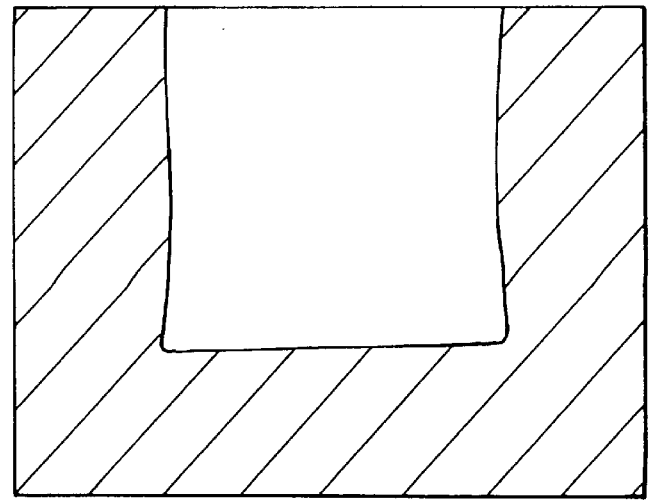
*Fig. 4*

Notch width variation for 380kHz (pulsed and unpulsed), 13.56MHz (pulsed and unpulsed) wafer bias cases.

Base of trench at edge of wafer after 2 minutes overetch.
380kHz wafer bias frequency, pulsed at typically 5ms cycle time, 50% duty cycle, one step process.

Base of trench at edge of wafer after 5 minutes overetch. 380 kHz wafer bias frequency, pulsed at typically 5ms cycle time, 50% duty cycle, one step process.

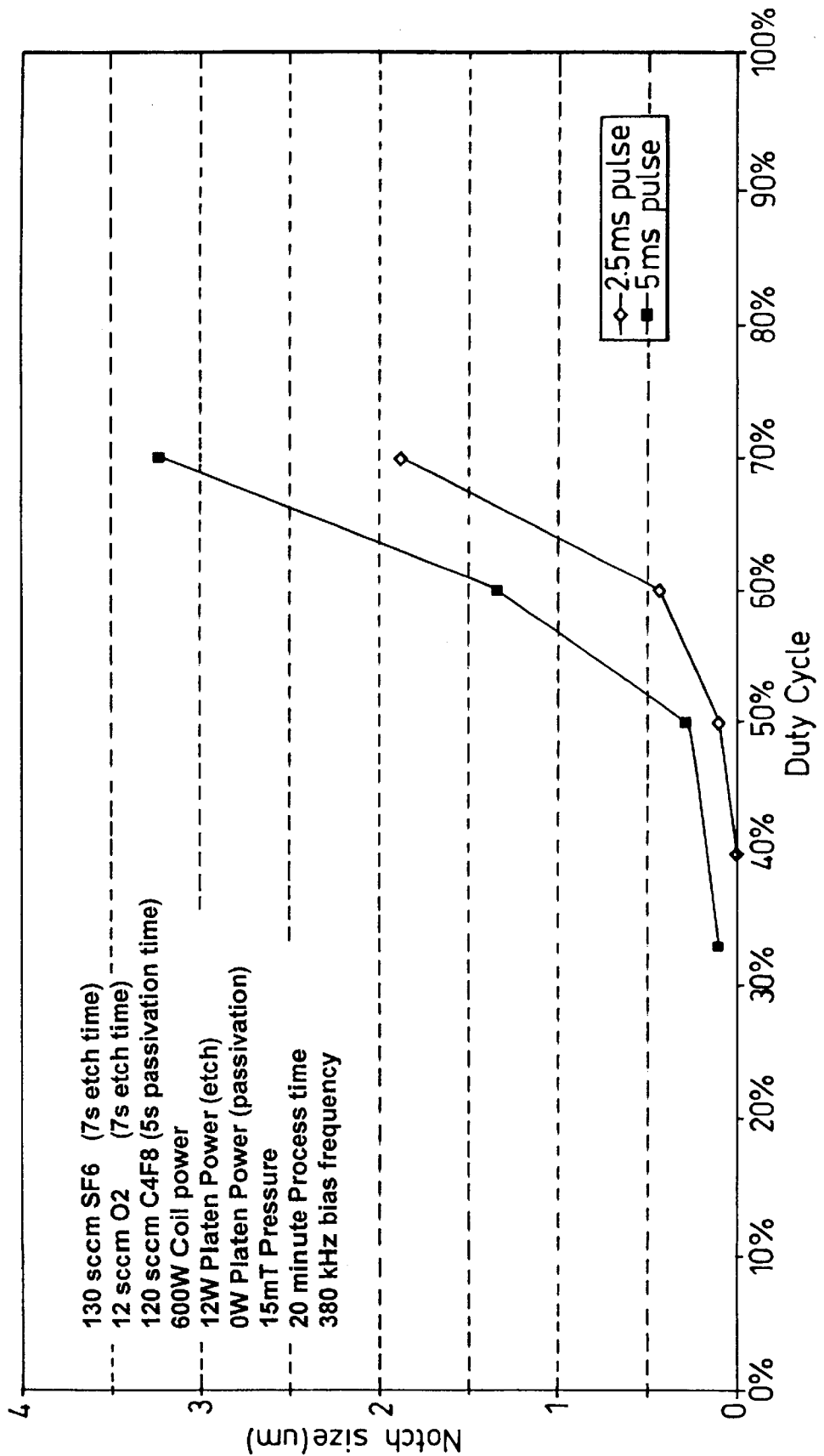
Fig. 7 Variation of notch size with duty cycle (SOI, 3μm trench)

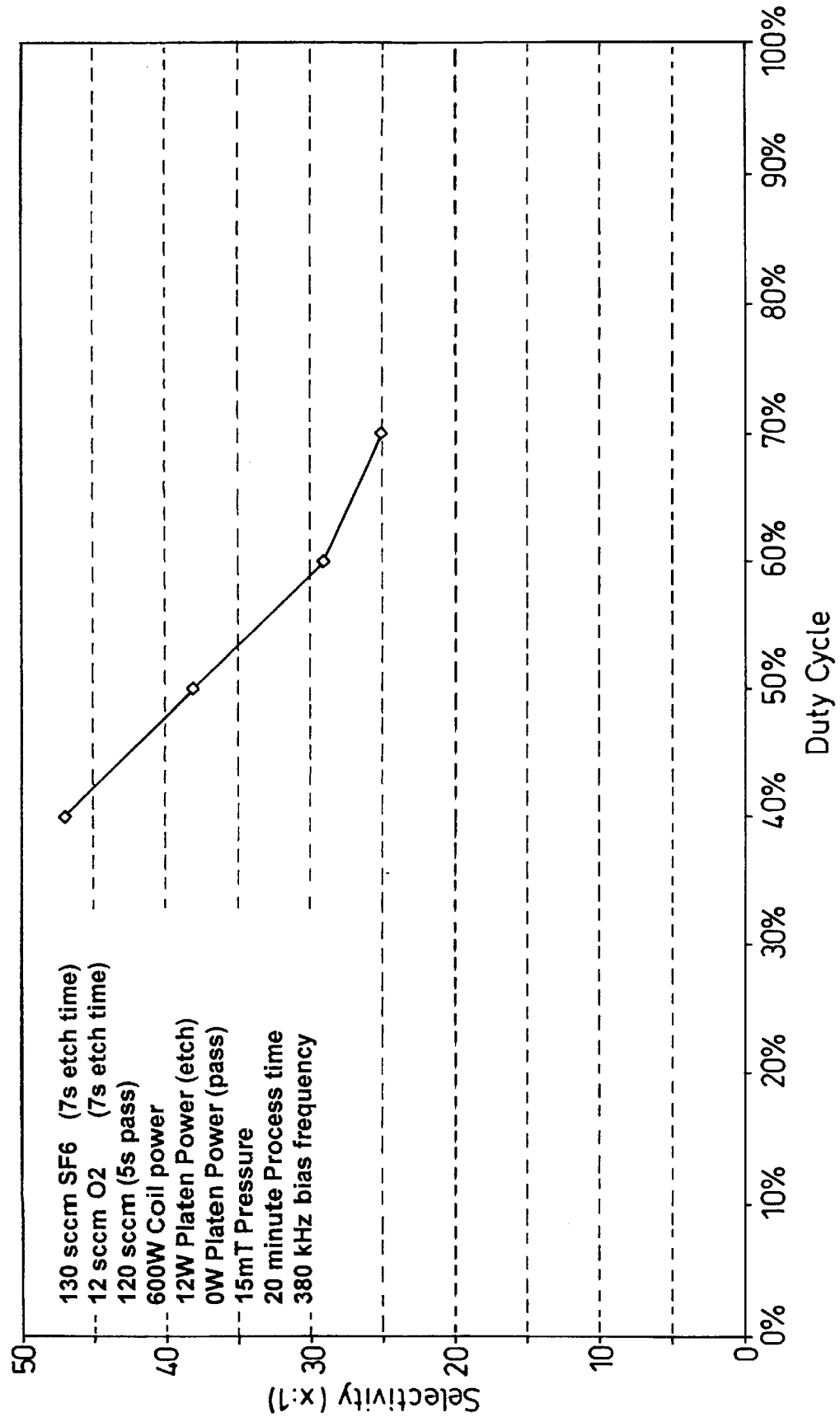
Fig. 8 Variation of selectivity with duty cycle
(Bulk, 2.5ms pulse, 10μm trench width)

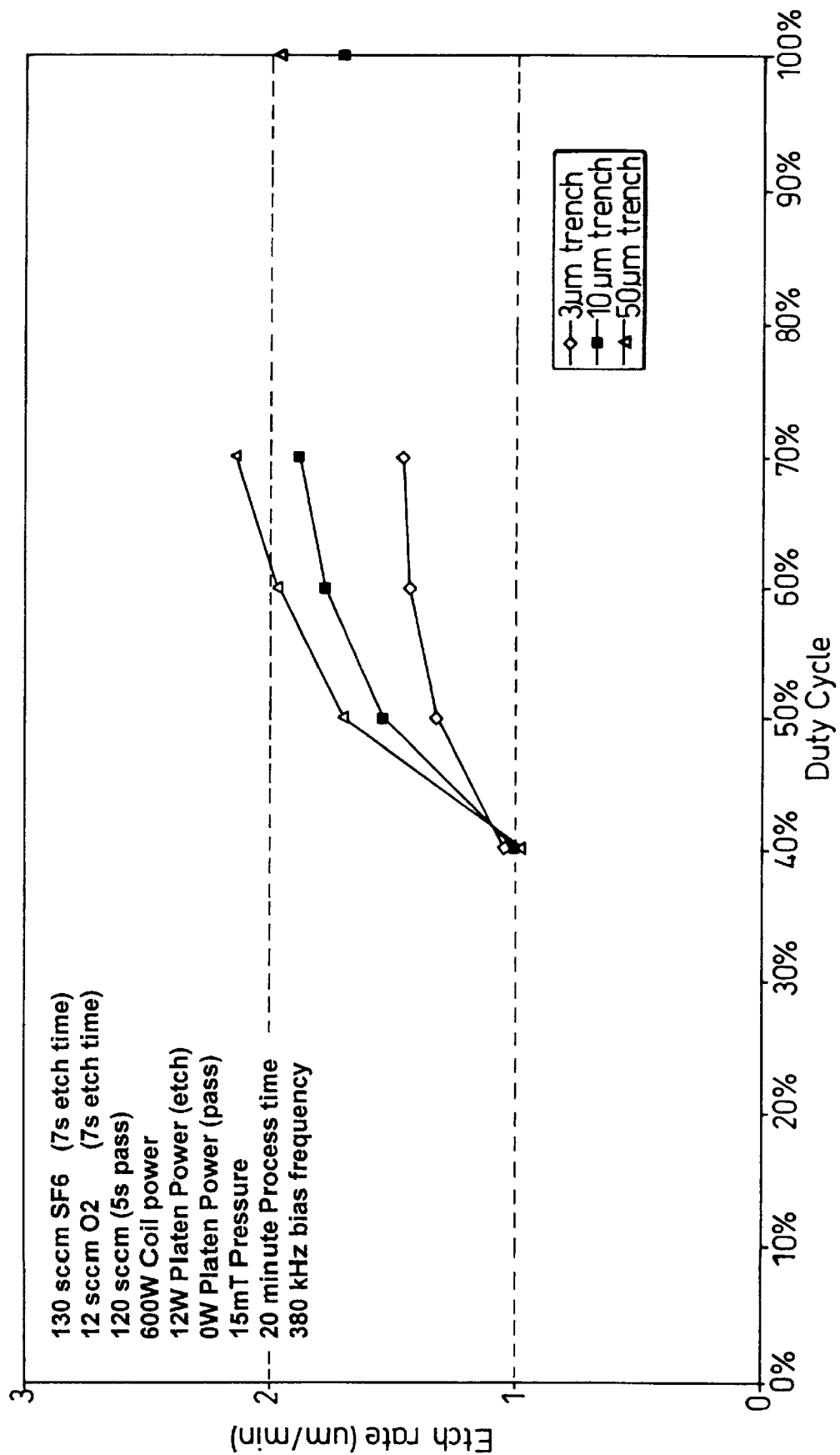
Fig. 9 Variation of etch rate with duty cycle (Bulk, 2.5ms pulse)

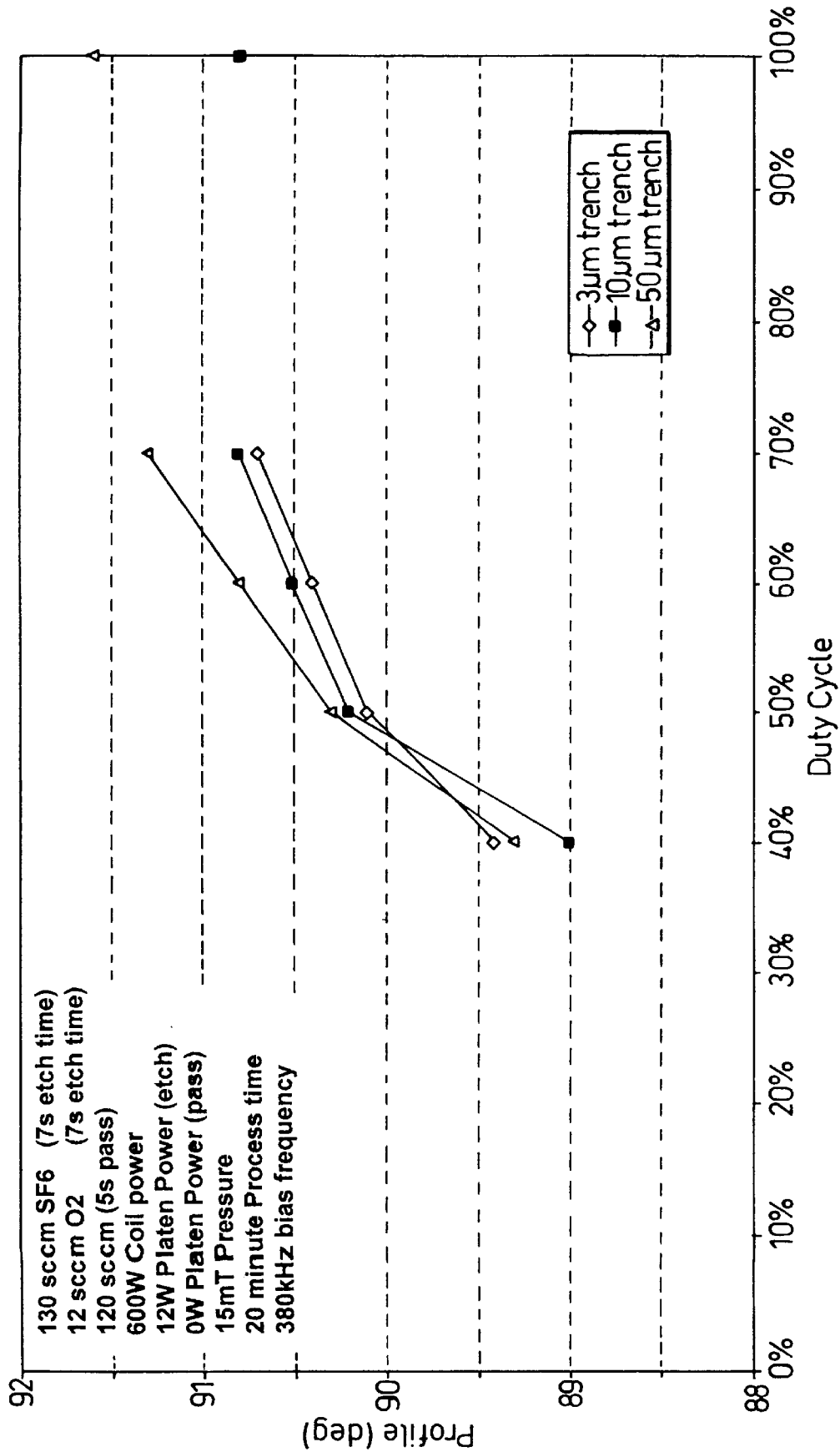
Fig. 10 Variation of sidewall angle with duty cycle (Bulk, 2.5ms pulse)

CIRCUIT TO PULSE RF FED TO PLATEN

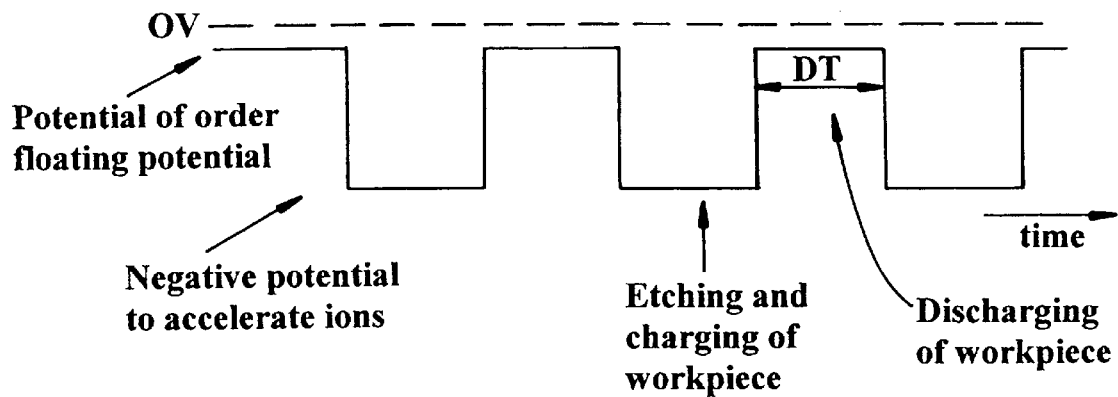
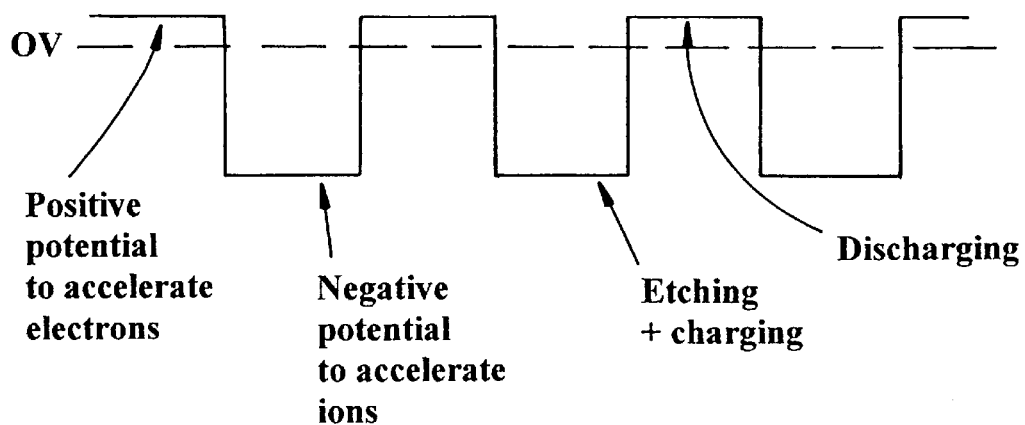
*Fig. 13*

METHOD AND APPARATUS FOR ETCHING A SUBSTRATE

CROSS REFERENCE TO RELATED APPLICATIONS

This is a continuation-in-part application of application Ser. No. 08/904,953, filed Aug. 1, 1997, now U.S. Pat. No. 6,051,503, which is hereby incorporated by reference in its entirety for all purposes.

This invention relates to a method and apparatus for plasma etching a feature in a substrate, for example a semiconductor substrate, in particular, although not exclusively, to a method of reducing or eliminating localised etching of the substrate ("notching") or charge damage at the interface with an insulating underlayer.

When etching silicon (or any other material), which becomes isolated by an insulating underlayer (such as silicon dioxide), the silicon accumulates charge as a result of the current drawn from the plasma during the process. This volume charge is proportional to the current, the surface area and the thickness of silicon above the oxide layer. The other factor which needs to be considered is that of the surface charge component on the silicon and the oxide. As this charge increases, it can have a proportionately increasing influence on the ion trajectory angle, which in turn influences the silicon etch profile, particularly at the silicon to oxide interface. The net result of excessive ion charging is localised etching of the silicon or "notching" at the oxide interface. It has been found that, if the oxide (or other dielectric) layer is replaced by a conducting layer, then the "notching" is not observed.

In some applications, this notching is highly undesirable, either due to causing problems in post processing steps (such as the re-fill of silicon isolation trenches), or due to the impact of the profile deterioration on the device performance.

A number of solutions to this problem have been proposed. Most are based on methods of either "neutralising" the accumulated surface charge, or reducing the ion charging of the silicon directly. For example, Toshihisa Nozawa et al (1994 Dry Process Symposium, Tokyo, I-8, p37ff) refers to the reduction of ion charging by operating at relatively higher pressures so that an increase in the negative ion concentration results in "neutralisation" of the accumulated surface charge. Whilst this method has been used with some success, operating at these pressures does cause some restrictions with respect to the etched profile such that it is not a suitable application for the entire etch. Indeed, the approach of using relatively higher pressures can only be used as a second etch step to approach the silicon interface, before the silicon begins to etch clear of the oxide interface.

Morioka et al, J. Vac. Sci. Technol. A 16(3), May/June 1998, pp 1588–1593 discloses the use of lower frequency to reduce notching and charge damage.

Kinoshita et al "Simulation of Topography Dependent Charging with Pulse Modulated Plasma", Proc.Sym. On Dry Process, Vol.18, I-6, pp 37–42, 1996 discloses source pulsing using continuous wave (CW) bias to achieve notch and charge damage reduction or elimination.

The theory of source pulsing reducing notching relates to the bias reduction as a result of the after-glow plasma during the off state, see Kinoshita et al. This approach works very well for low pressure HDP processing and as such it has inherent limitations. The major drawback is that the method only works when the plasma completely extinguishes. The plasma essentially comprises two excitation components, the first results from the source (ICP,ECR etc) and the second results from the RF bias. These two components control the plasma density and self bias potential for ion acceleration respectively. When the source power is reduced, the self bias increases proportionately. Thus, when the source power is off, extremely high self bias voltages are obtained until or unless the plasma extinguishes. If the plasma does extinguish (which is certainly valid for low pressure and low bias power operation, cited in the prior art references including Kinoshita), source pulsing is an effective solution. However, for relatively higher pressure plasmas (approaching or greater than 10 mTorr), the plasma does not extinguish, even at low bias RF power levels. In such cases the source pulsing method is not suitable.

During source power switching with CW RF bias, for the reasons explained above, as the source power switches off, high self bias transient voltages are inevitable. These transients may lead to charge damage. As the source power levels increase (to enhance the etching rate), this effect will increase and potentially cause unacceptable charge damage and possibly even increased notching.

Maruyama et al, "Reduction in charge build-up with pulse-modulated bias in pulsed ECR plasma", IEE Proc. Dry Process Sym. Japan, I-4 pp 21–26, 1997 discloses the use of a pulsed bias at 13.56 MHz (high frequency), but reports a residual notch size of at least 70 nm in the best case.

The method of this invention, in at least some embodiments, addresses or reduces these various problems.

According to a first aspect of the present invention, there is provided a method of etching a feature in a substrate in a chamber, the method comprising alternately etching by means of a plasma and depositing a passivation layer by means of a plasma, wherein a bias frequency is applied to the substrate which is at or below the ion plasma frequency.

The bias frequency may or may not be pulsed.

According to a second aspect of the present invention, there is provided a method of etching a feature in a substrate in a chamber, the method comprising alternately etching by means of a plasma and depositing a passivation layer by means of a plasma, wherein a pulsed bias frequency is applied to the substrate.

In this aspect of the invention a high or low bias frequency may be applied.

According to a third aspect of the present invention, there is provided a method of etching a feature in a substrate in a chamber by means of a plasma, the method comprising applying a pulsed bias frequency to the substrate which is at or below the ion plasma frequency.

The ion plasma frequency is represented by $\omega_{pi}$.

The bias frequency may be produced by an rf or dc bias power supply, and is preferably applied to a support or platen on which the substrate may be positioned. A dc bias which is pulsed is particularly suitable if the substrate is sufficiently conducting or is of a form where most of the material is conducting but a thin insulating layer may exist within the structure. The dc bias may be pulsed in conjunction with CW or pulsed rf bias.

The substrate is preferably a semiconductor, for example silicon. In a particular embodiment, the substrate comprises an insulating underlayer. This underlayer may be an oxide. In the embodiment in which silicon is used as the semiconductor, silicon dioxide is the underlayer. However, for example, the invention also relates to etching polysilicon and other conductors (eg $WSi_2$ or indeed other metal silicides) over gate oxide. Alternatives are well known to a person skilled in the art.

By using a low bias frequency, reduced "notching" or charge damage may be achieved. In a preferred embodiment, the bias frequency is at or below 4 MHz, and even more preferably is in the range of 50 kHz to 380 kHz.

The method may comprise a further etching and passivating step (step 2) which is carried out at a higher pressure than the etching or alternate etching and deposition step. This further step may or may not be alternately cyclic. In particular, this further step which is carried out at a higher pressure is started when the underlayer is approached, for example in one embodiment either just before or any time up to just after the silicon begins to etch clear from the oxide interface.

For example, when etching thick silicon (>several microns) on the insulator then step 1 is used until critical features have approximately 0.5 $\mu$m of silicon remaining to be etched, at the substrate edge. The edges etch faster than the substrate centre. At the centre there is approximately 1 $\mu$m silicon remaining to be etched. Step 2 is then used until the oxide is reached at all points of the substrate and a sufficient over etch may be used to ensure this.

This further etching and passivation step provides a reduction in the rate of increase in the notch size as a function of over-etch time. Preferably, in this embodiment, the method further comprises an end-point detection step to determine when to switch from the etching or alternate etching and deposition first step to the further etching and passivating step.

However, when the bias frequency is pulsed, the further etching and passivating step at a higher pressure is not necessary and therefore the process window is much wider, allowing higher mean etching rates as well as avoiding profile deterioration. Furthermore, in this embodiment end point detection is not necessary and a greatly improved notch width control over a much wider range of feature sizes is achieved. Indeed, the notching may be eliminated using this method.

We define the duty cycle as the ratio of pulse on time (or pulse width) to pulse off time. The pulse width and duty cycle that is ideally required depends on the bias frequency and the RC time constant associated with the charge build up on the oxide interface. It should be noted that it is more attractive commercially to pulse lower power supplies that are used for biasing rather than significantly higher power source supplies, as in the prior art.

It is the pulse off duration which determines the degree of discharging.

The pulse off time is preferably greater than 100 $\mu$s. The pulse off time is preferably applied for between 10% to 90% of the time (ie. 10% to 90% duty cycle). Preferably, the duty cycle is controlled in proportion to the pulse off time. A shorter pulse off time will allow a greater duty cycle and vice versa.

A magnetic filter as described in British patent application 9827196.8 may be used to partially or completely divide the volume of the chamber in which the plasma is formed, from the volume in which the wafer or workpiece support is located. The filter has the effect of reducing the plasma density, but also reduces the electron temperature, making conditions favourable for increased numbers of negative ions to reach the vicinity of the wafer. When used in conjunction with a sufficiently low frequency bias on the wafer support, positive ions will be accelerated towards the wafer during the more negative part of the cycle. Negative ions and electrons will be accelerated towards the wafer during the more positive part of the cycle. A superimposed negative self bias will form unless the fraction of electrons is extremely small. The flux of negative ions reaching the wafer during the relevant part of the cycle, will etch material in a similar way to positive ions, but will also act to reduce charging produced by the positive ions. Pulsing of the bias may be utilised if required.

According to a further aspect of the present invention, there is provided an apparatus for performing any of the above methods, the apparatus comprising a chamber having a support for a substrate and means for etching a feature in the substrate by means of a plasma.

Depending upon the method of the invention, the apparatus may also comprise any or all of: means for alternately etching the substrate by means of a plasma and depositing a passivation layer by means of a plasma, means for providing a bias frequency to the substrate at or below the ion plasma frequency, and means for pulsing the bias frequency.

Although the invention has been defined above, it is to be understood that it includes any inventive combination of the features set out above or in the following description.

The invention may be performed in various ways and a specific embodiment will now be described by way of example, with reference to the accompanying drawings, and in which:

FIGS. 1A and 1B are schematic cross-section views explaining notching;

Figure 5:
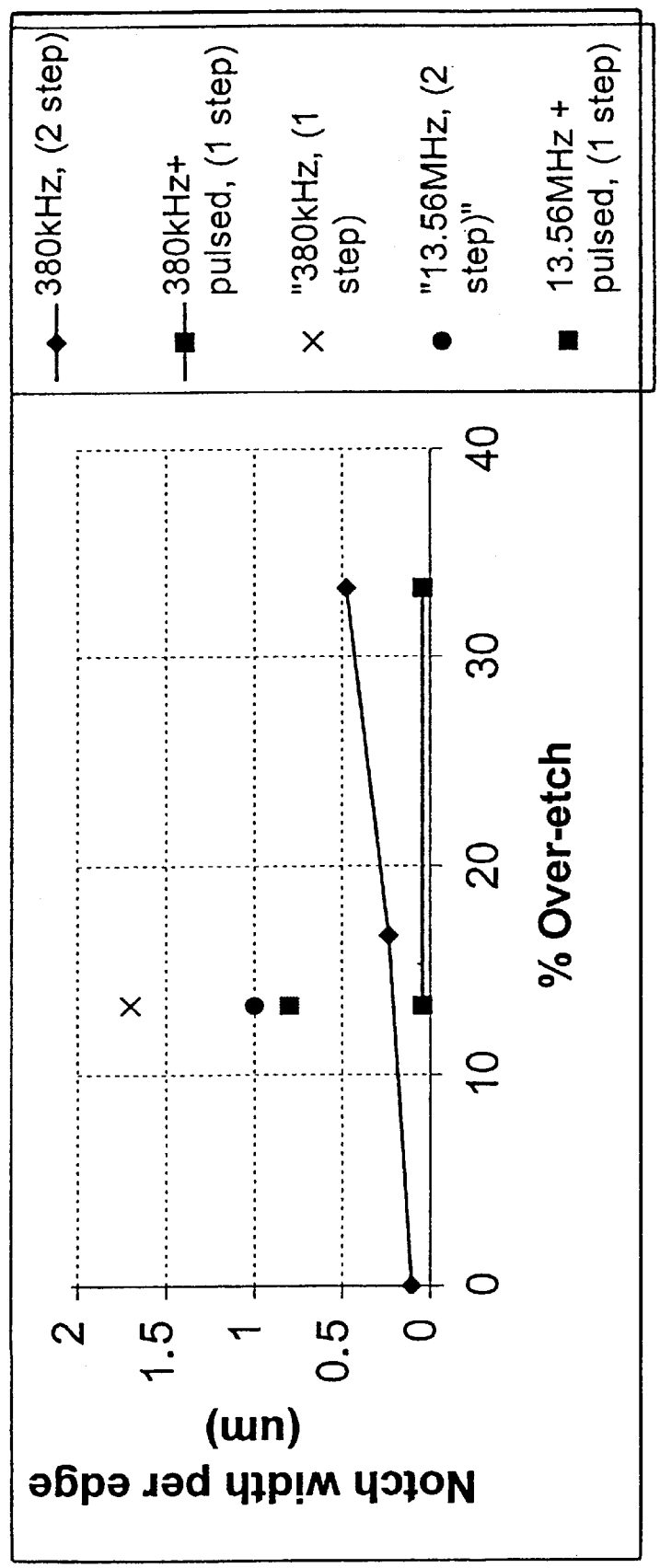
Figure 6A:
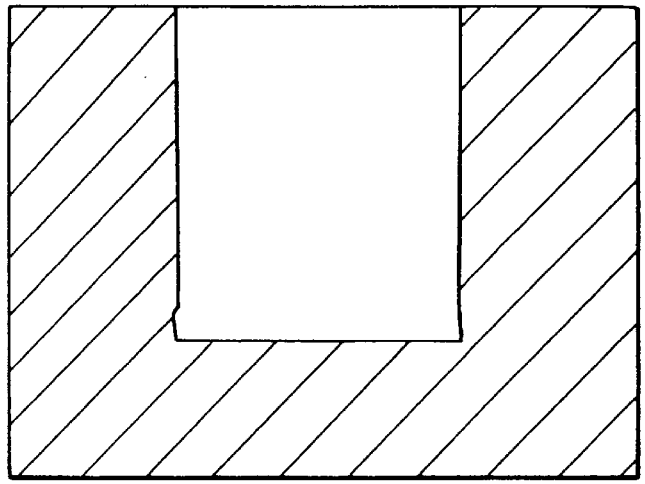
Figure 11:
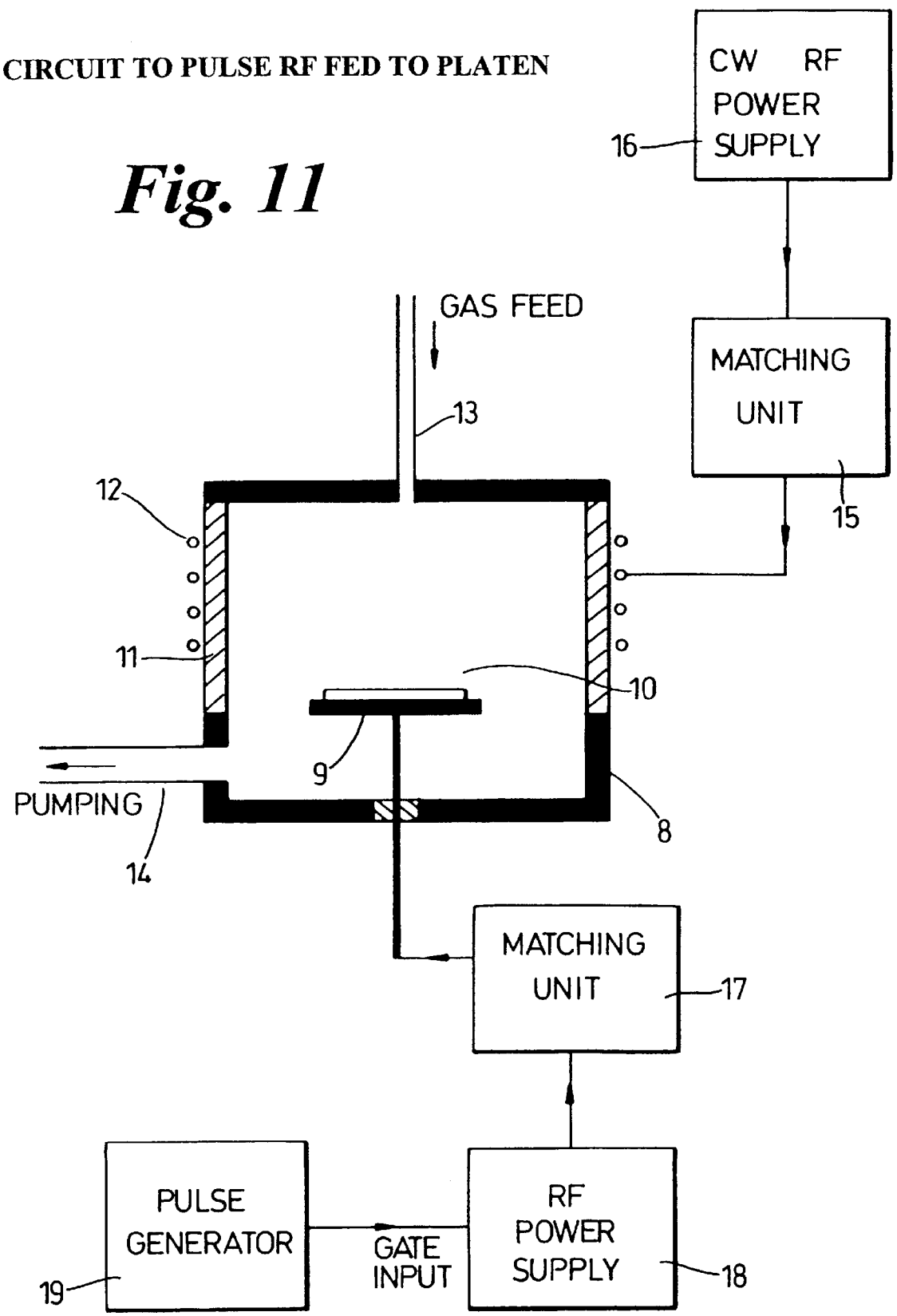
Figure 12:
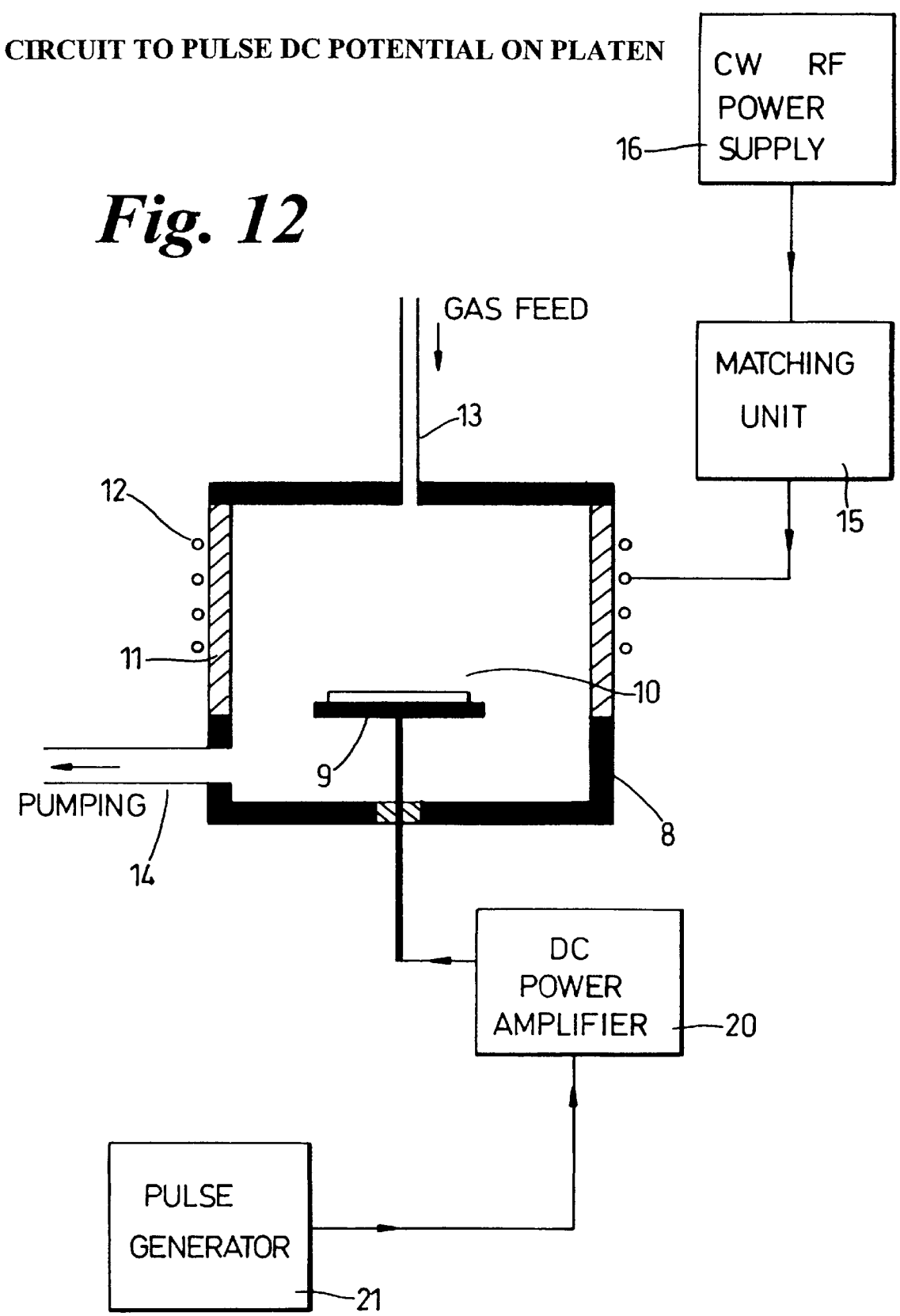
Figure 14:
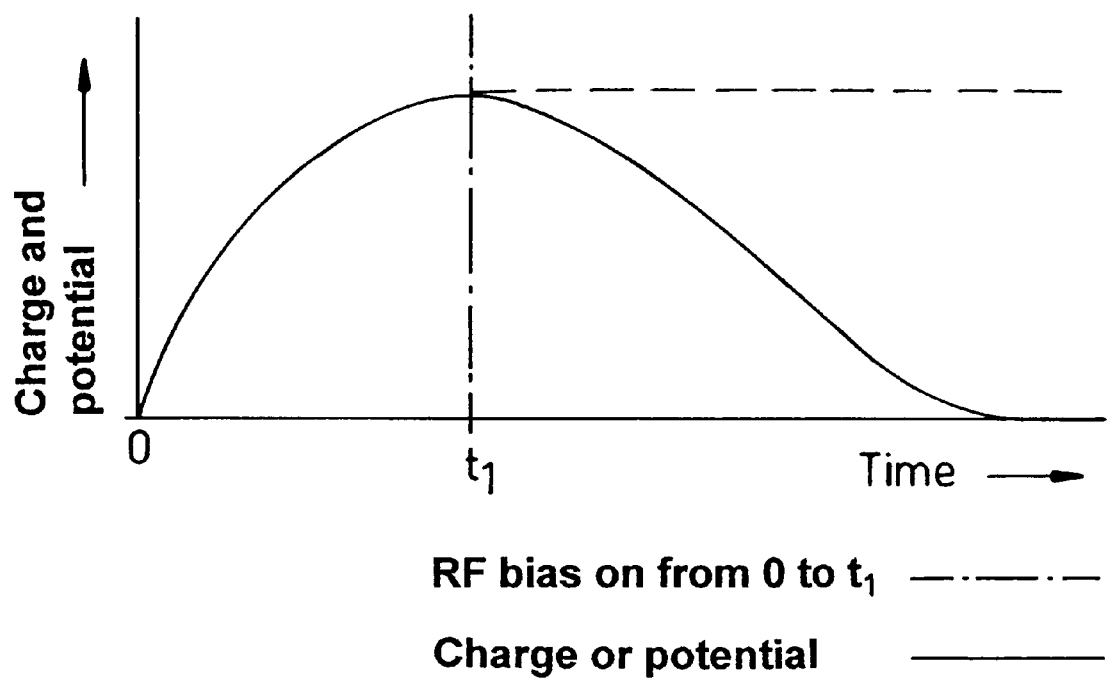
Figure 15:
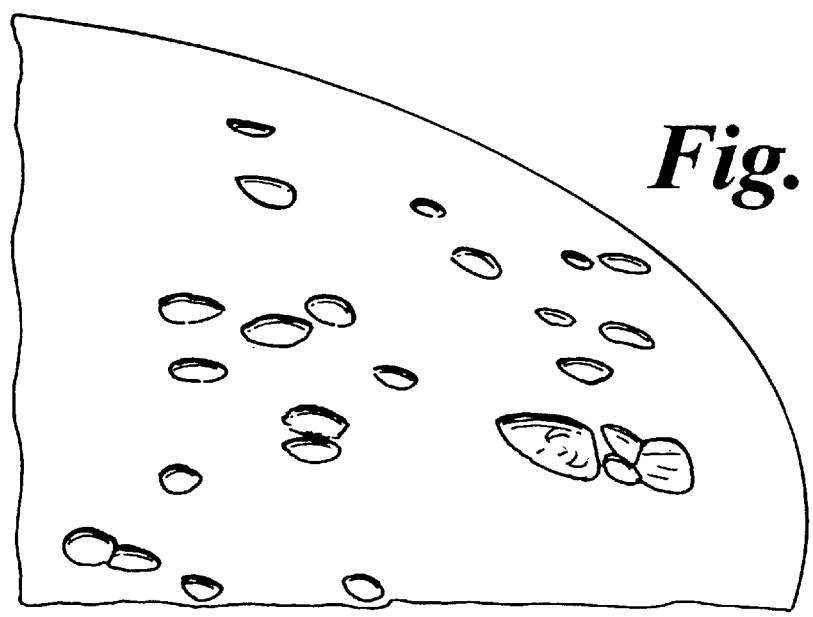
Figure 16:
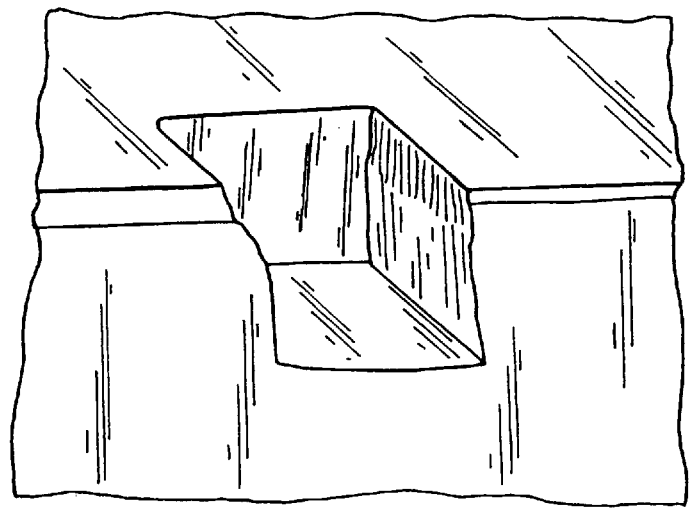

FIGS. 4A to C show SEMs achieved from the present invention;

FIG. 5 is a graph showing the rate of increase in notch size as a function of over-etch time;

FIGS. 6A and B show SEMs achieved by the process of the present invention;

FIGS. 7 to 10 are graphs showing the variation of various parameters with duty cycle;

FIGS. 11 and 12 show alternative circuits for use in the present invention,

FIG. 13 shows details of bias options,

FIG. 14 shows a graph of charge and potential versus time,

FIGS. 15 and 16 show typical effects on etching an insulating substrate, and

Figure 17:
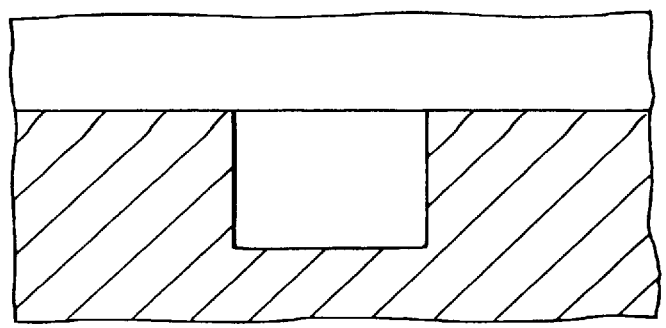

FIG. 17 shows the result of pulsing rf bias in etching an insulating substrate.

Referring to FIGS. 1A and 1B, there is shown a substrate generally at 1. The substrate 1 comprises a silicon semiconductor 2 with a silicon dioxide underlayer 3. On the upper surface of semiconductor 2 is a masking layer 4. On etching a substrate in a plasma, for example by the method disclosed in WO-A-94/14187, a trench 5 is formed. Ions are shown at 6 and electrons are shown at 7.

The present invention seeks to reduce or eliminate notching.

When RF bias is applied to the Platen, the ions will be accelerated towards the wafer/workpiece throughout most of the RF cycle. The electrons which must reach the wafer to balance the ion flux, will only reach the wafer during the most positive part of the RF cycle.

For high frequencies >$\omega_{pi}$, the ions are not able to respond to the instantaneous electric potential and are accelerated by the time averaged potential which is of order Vpp/2. The ions which reach the wafer will generally have an energy distribution function which is relatively narrow and centered around Vpp/2.

For low frequencies $<\omega_{pi}$, the ions can to some extent respond to the instantaneous RF potential, progressively more so as the frequency is reduced. The ion energy distribution function will therefore become progressively wider as the frequency is dropped with energy extending towards the limits of at maximum Vpp and at minimum near to zero, centered close to Vpp/2.

At the high frequencies the ion energy distribution has a relatively higher number of high energy ions which allows most of these ions to reach the bottom of deep trenches. Etching takes place down to any insulating layer, which can then charge positive, leading to deflection of further ions to cause notching. This build up of high positive potential is limited by the electrons, which become increasingly attracted as the charge accumulates. The major impact of the electrons is to negatively charge the top surface (particularly the edge) of the trenches due to their isotropic directionality. This acts as a "potential barrier" effectively reducing the number of electrons which will pass further into the trench as this surface charge increases. The ions conversely have a narrow angular spread and increased directionality. As the aspect ratio increases, the electrons are increasingly shielded from the accumulated positive charge at the bottom of the trench as the net electric field effect from this charge decreases.

Low energy ions have lower directionality, or in other words increased directional isotropy. This makes these ions more able to provide surface electron charge neutralization. At the low frequencies, the ion energy distribution function broadens and increases the number of lower energy ions. This allows some neutralization of the negative charge at the top of the trenches, which then reduces the "potential barrier" a bit further and permits further electrons to reach the bottom of the trench and reduce the positive charge which builds up on an insulating layer. This reduces the potential at the bottom of the trench and also reduces the degree of notching.

If the RF bias applied to the Platen is pulsed on and off, during the off periods the ion sheath will relax to the steady dc situation in which the wafer reaches conventional plasma floating potential. All ions are accelerated to a much lower energy when compared with the result of RF bias, and have a larger angular distribution. This further increases the ability to reduce the negative charge near the top of the trenches and to a further reduction in the positive charging of an insulating layer at the bottom of the trenches. The result is reduced notching as shown in FIG. 1B. The positive potential at the bottom of the trench is also further reduced due to the easier access of electrons to the insulating surface as the potential barrier is reduced further. During the RF off period the low energy of the positive ions is insufficient to remove the passivating layer at the bottom of the trenches, and this is only removed by the higher energy ions when the RF is switched back on.

It can therefore be seen that a reduction in notching and the reduction of high potentials at the insulating surface can be achieved by decreasing the Platen RF bias frequency and further reductions are achieved by pulsing the RF bias on and off. The RF bias off time here must exceed an RC time constant which represents the oxide surface charging and this is estimated as being of the order of several milliseconds for low frequency (380 kHz) and several hundreds of micro-seconds for high frequency (13.56 MHz).

To summarise, FIG. 1A shows:
1. Accelerated ions are directional, electrons are isotropic.
2. Directional ions ⊕ reach trench base and cause charge build up on the oxide, resulting in the potential V+.
3. Directionally isotropic electrons charge surface of trench, and only a few reach the base to neutralize the ion charge.
4. Ion charge potential V+ on the oxide is determined by the ion energy distribution function (IEDF), refer to Kinoshita et al.
5. Ions ⊕ with an energy >V+ contribute to increasing V+.
6. Ions ⊕ (shaded) with an energy <V+ are deflected towards the sidewall by V+ and contribute to notching.

FIG. 1B shows:
1. IEDF changes to result in greater number of lower energy ions ⊕ (shaded).
2. These ions ⊕ (shaded) have greater directional isotropy and reduced mean ion energy.
3. This results in reduced electron charging of the top of the trenches, and increases the number of electrons e- which reach the bottom of the trench and neutralize the charge.
4. The ions reaching the bottom of the trench have reduced energy, but they still have directionality. When the RF bias is in the off state, ions will gain energy corresponding to the potential difference between the plasma and floating potentials.
5. These effects will reduce the charge potential V+.
6. This charge may be lower than the threshold for damage to the oxide.
7. Lower energy ions are deflected by V+ into the side walls with an increased angular distribution.
8. These ions do not have sufficient energy to cause notching.

It should be noted that conventional non-switched plasma etching means may also be applied and these are well known to those skilled in the art.

During a pulse cycle, the charge and potential on the insulating layer at the bottom of a trench will follow the trend shown by the solid line in FIG. 14. RF bias is applied to the platen during the period from t=o to t=$t_1$. Positive charge increases on the bottom of the trench as does the positive potential to attract some electrons. Saturation of charge and potential is reached, as shown by the dashed line, when the potential has reached a level which prevents further positive ions from reaching the bottom of the trench. At time $t_1$, the RF bias is switched off, low energy positive ions with large angular spread start to neutralise the negative charge near the top of the trench, allowing more electrons to reach the bottom of the trench. The positive charge at the bottom of the trench reduces steadily and the potential reduces, until electron and positive ion fluxes come to a balance.

It is generally desirable to reduce the RF bias gate pulse length from that shown in FIG. 14, in order to reduce the magnitudes of charge and potential built up at the bottom of the trench, before discharging takes place.

Figure 2A:
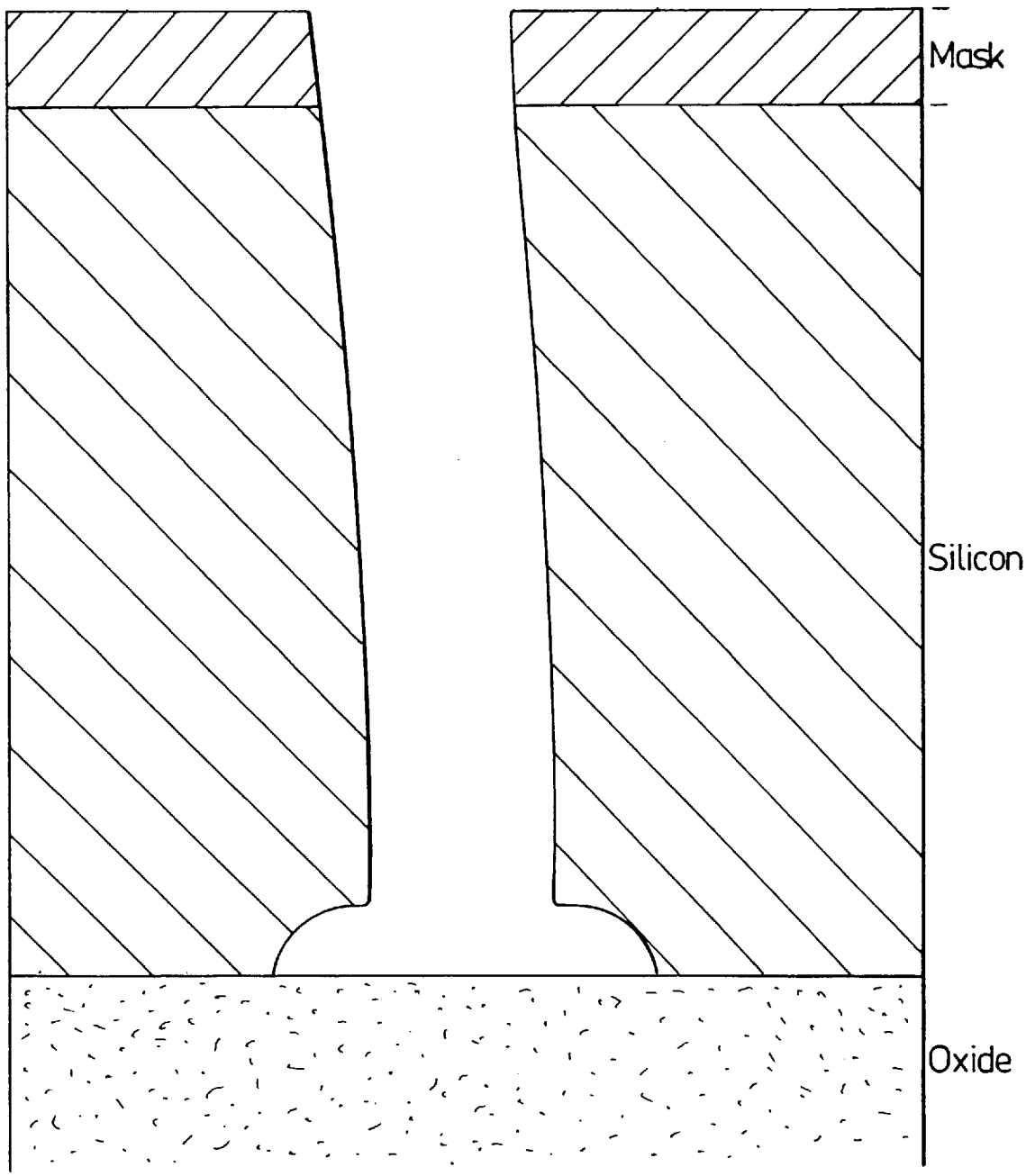
FIGS. 2A and 2B show scanning electron micrographs (SEMs) showing the etching of a prior art process.
Figure 2B:
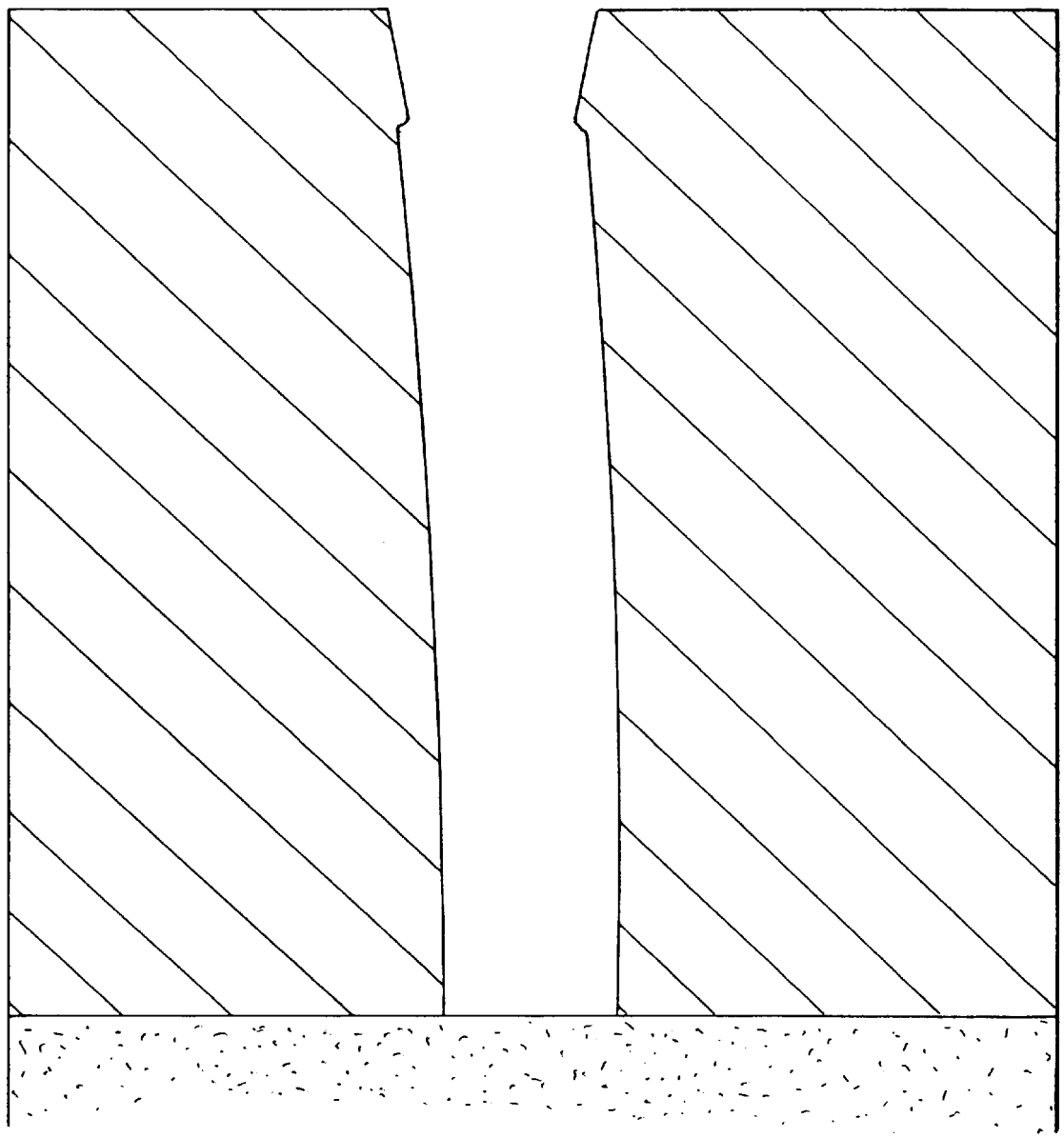

Referring to FIG. 2, there is shown an SEM in FIG. 2A showing the notching of the silicon at the oxide interface as discussed above in relation to the prior art. These are the results obtained using cyclic etch/passivation (referred to as step 1) only with a 13.56 MHz bias frequency. FIG. 2B shows the profile without notching obtained by using the two step (step 1 and step 2) process, the step 2 process being carried out at a higher pressure and higher passivation level as discussed above. A 13.56 MHz bias frequency was used. The trench etch in step 1 is etched using the method disclosed in WO-A-94/14187 (cyclic etch/passivation). Step 2 may or may not be switched in the same manner. In this case this was also switched, but at higher pressure and with a higher passivation content to reduce the notching, alternative process conditions may be:
Step 1
  Etch Step:
    130 sccm SF$_6$ (8 s cycle on time), 600 Watts Coil Power (13.56 MHz), 8–12 W Platen Power (13.56 MHz), 20 mT pressure, 20 degrees centigrade platen temperature.
  Passivation Step:
    100 sccm C$_4$F$_8$ (5 s cycle on time), 600 Watts Coil Power (13.56 MHz), 0 W Platen Power (13.56 MHz), 17 mT pressure, 20 degrees centigrade platen temperature.
Step 2
  Etch step:
    100 sccm SF$_6$+60 sccm C$_4$F$_8$ (12 s cycle on-time), 600–800 W Coil Power (13.56 MHz), 12–17 W Platen Power (13.56 MHz), 65–75 mT pressure, 20 degrees centigrade platen temperature
  Passivation Step:
    120 sccm C$_4$F$_8$ (5 s cycle on-time) 600 Watts Coil Power (13.56 MHz), 0 W Platen Power (13.56 MHz), 55 mT pressure, 20 degrees centigrade platen temperature.

Figure 3:
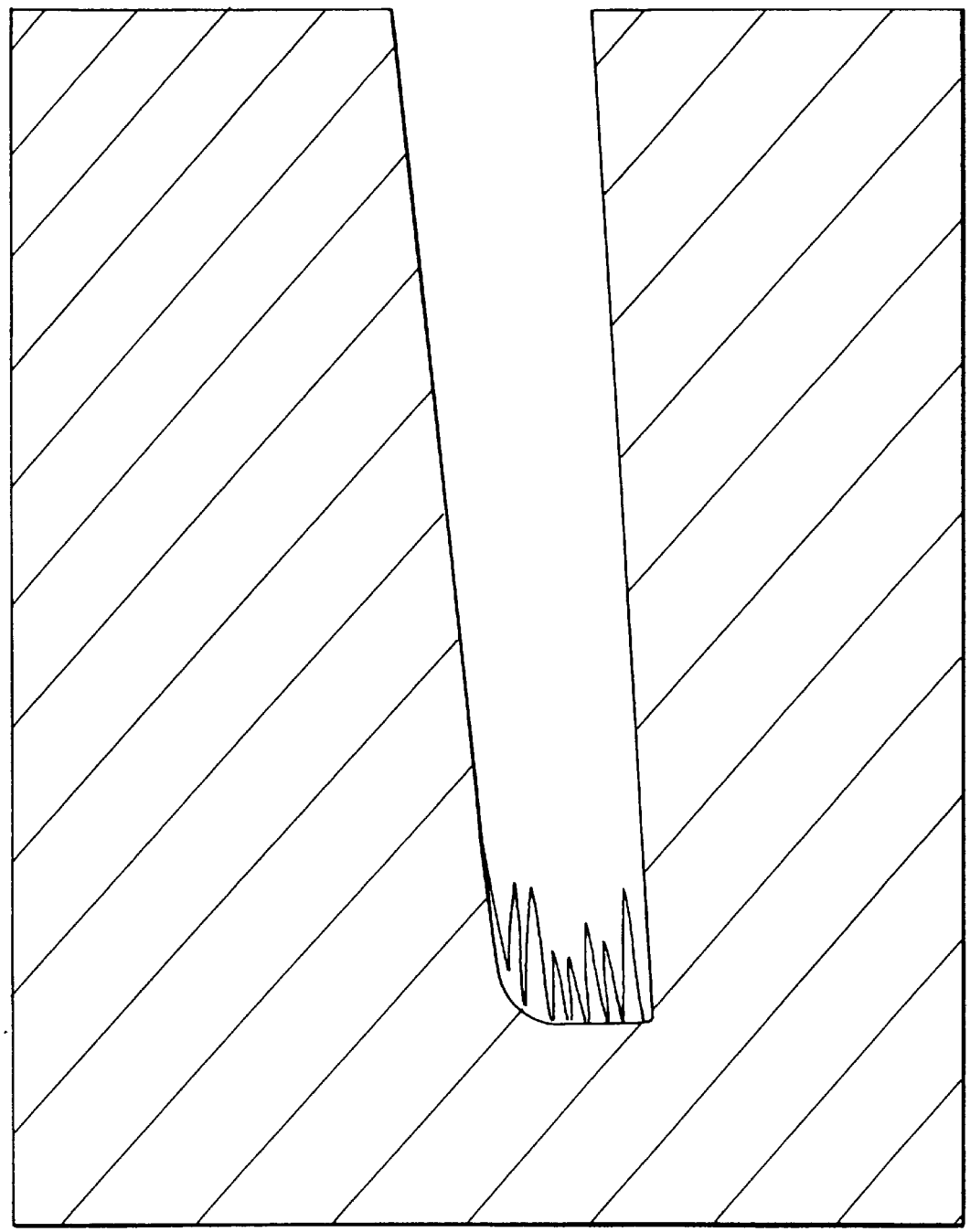
FIG. 3 shows a further SEM of the prior art in which grass formation results.

This step 2 is suitable to etch depths typically up to several microns. The SEM in FIG. 3 shows the result of using step 2 for etch depths greater than this, demonstrating the limitation of this second step. Typically the second step differs from the first in that the etch rate is reduced (by a factor of 3 or 4) and also as the depth increases, grass formation results in the termination of the etch. Thus, the first step has relatively high etch rate which is not depth limited due to residue or grass formation. Both effects are the result of the enhanced passivation in the second step, which is necessary along with the higher pressure in order to reduce the notching. Therefore, the first step is balanced in favour of etching over deposition (without any net deposition build up), while the second step balance exhibits a net deposition build up. As the first step aggressively notches, it is important to adequately terminate this step and switch to the second step before notching can occur. This transition is typically detected by means of an endpoint detection system, which can be used either to detect the instant the oxide underlayer is reached or detect the remaining silicon thickness when approaching the interface. It is essential to use this endpoint method in the known processes to facilitate the first to second step transition to ensure wafer to wafer repeatability, particularly when the initial silicon thickness on top of the oxide can vary.

The second step also has to allow over-etching. Over-etch is defined as the additional etching time after the first area of oxide becomes exposed (by etching the silicon clear) in any part of the substrate (wafer). As the etch rate varies across the substrate usually radially, some areas will have interface exposure prior to others. This implies that in order to clear the silicon from all areas of the substrate, some over-etching is necessary. In addition, other well known effects such as (Reactive Ion Etching) "RIE Lag" and "Microloading" mean that the etch rate can further vary with feature size and across areas of the substrate wafer with differing ratios of mask to silicon exposure. This places a greater emphasis on the need to over-etch and maintain the etched profile during it.

The present invention in one embodiment eliminates the notching by significantly reducing the ion charging of the silicon using a pulsed low frequency rf bias power supply.

In known processes, the rf bias is applied in the few MHz to 40 MHz range, typically at 13.56 MHz. However, it has been found that this frequency is above the ion plasma frequency, so that the ions do not respond to the rf field. Instead they respond only to the dc self bias potential. The electrons due to their small size and mass have much higher mobility and respond to the rf excitation.

In one example of the present invention, bias frequencies of 380 kHz and 187 kHz are used. The SEMs in FIG. 4 show the best result obtained at silicon/oxide interface after using either lower excitation frequency.

Low frequency only (unpulsed) process conditions may be:
Step 1
  Etch step:
    100 sccm SF$_6$ (5 s cycle on time), 600 W Coil Power (13.56 MHz), 4–8 W Platen Power (380 kHz), 20 mT Pressure, 20 degrees centigrade platen temperature.
  Passivation step:
    130 sccm C$_4$F$_8$ (5 s cycle on time), 600 W Coil Power (13.56 MHz), 0 W Platen Power (380 kHz), about 22 mT Pressure, 20 degrees centigrade platen temperature.
  A total of 8 minutes process time for step 1.
Step 2
  Etch step:
    100 sccm SF$_6$+60 sccm C$_4$F$_8$ (10 s cycle on time), 800 W Coil Power (13.56 MHz), 6–8 W Platen Power (380 kHz), about 60–75 mT Pressure, 20 degrees centigrade platen temperature.
  Passivation step:
    130 sccm C$_4$F$_8$ (5 s cycle on time), 800 W Coil Power (13.56 MHz), 0 W Platen Power, about 45 mT Pressure, 20 degrees centigrade platen temperature.

FIG. 4A shows the results using a low frequency bias in step 1 only. FIG. 4B shows the results using a low frequency bias in both step 1 and step 2. FIG. 4C shows a close up of the trench base at the silicon-oxide interface. Even at lower frequencies, it was found to be necessary to use a high pressure process with a higher passivation content to achieve the zero notch result shown in FIG. 4B. Again, this higher pressure process/higher passivation step could not be used for the entire etch depth as surface residues or "grass" appears when etch depths of about 5 μm are exceeded. As with the high frequency bias of the prior art, etch rates for this second step are lower and in addition prolonged second step processing directly leads to profile bowing. Nevertheless, there is still an advantage with the lower frequency biasing of the invention. This can be summarised as a reduction in the rate of increase in notch size as a function of over-etch time, as shown in FIG. 5. This benefit allows better control of the notch size compared to higher frequencies.

End-point detection will still be required for determining the step 1 to step 2 transition time.

The ion plasma frequency is given by:

$$\omega_{pi} = (n_i Z^2 e^2 / \epsilon_0 m_i)^{1/2}$$

where $n_i$, $m_i$, are ion density and mass, Z is ionic charge number, e is elementary charge and $\epsilon_0$ is permittivity constant of vacuum.

The etching step is typically carried out using a high fluorine liberating gas such as SF$_6$ or NF$_3$ whilst the deposition is carried out with a polymerisation gas such as C$_4$F$_8$. O$_2$ may additionally be added during the etching step only. Assuming for example the etch gas to be SF$_6$, then the above equation can be used to calculate $\omega_{pi}$, as shown in Table 1 below.

The following Table 1 shows the ion plasma frequency value of the range of singly charged ions that are possible in the SF$_6^+$ plasma used to etch silicon. The data shows that the ion plasma frequency is in the 5 to 10 MHz range. However, for the relatively low electron temperature and low pressure plasmas in question, the predominant ions will tend to be the $SF_4^+$ and $SF_5^+$. Hence the lower value of ion frequency is most relevant. In the present context, $\omega_{pi}$ (expressed in MHz) will be taken as sub 5 MHz.

TABLE 1

$\omega_{pi}$ of Dominant Singly Charged Ions in an $SF_6$ Plasma Discharge.

| Ionic Species | Ion Plasma Frequency $\omega_{pi}$, in MHz |
|---|---|
| $SF^+$ | 9.31 |
| $SF_2^+$ | 7.84 |
| $SF_3^+$ | 7.05 |
| $SF_4^+$ | 6.40 |
| $SF_5^+$ | 5.90 |
| $SF_6^+$ | 5.50 |

It is suggested that the ion charging will reduce as the ions increasingly respond to the rf field, that is at frequencies approaching or below the ion plasma frequency. Thus for bias frequency values of <4 MHz, the ion response to the rf field will reduce the ion charging effects of the silicon surface. This means that during part of the rf cycle, ions will not be accelerated towards the platen which acts as the cathode, so that the electrons can partially neutralise the positive charge accumulation.

Figure 6B:
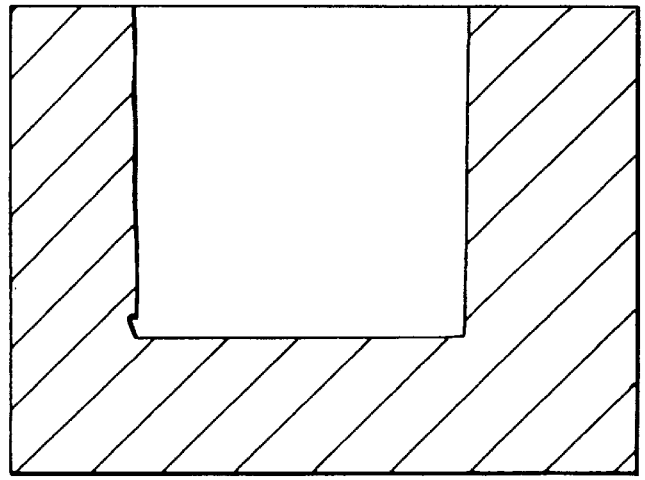

Results of pulse modulation of the low frequency bias are shown in FIG. 5 and the SEMs in FIGS. 6A and 6B. This data shows a dramatic reduction in notch size (<150 nm per edge in all cases), using 380 kHz bias frequency, pulsed width of 2.5 to 5 ms, <50% duty cycle. The SEMs and graph also indicate that there is a significant decrease in the rate of increase in notch size as a function of over-etch time. This notch reduction is achieved at lower pressures, and without enhanced passivation, which means an additional step in the process is no longer needed. Most significantly, the SEMs show the result of a single step only now etching at high rates without notching the silicon even after significant over-etching. This also implies that end-point detection is no longer required as there is no second step.

Experiments were carried out over a range of pulse widths (100 $\mu$s to 5 ms) and duty cycles (30% to 100%). The results suggest that the notching is most successfully eliminated for pulse widths <2.5 ms for <50% duty cycle, or in other words for pulse off times >2.5 ms.

FIG. 7 shows the notch size as a function of duty cycle for both 2.5 ms and 5 ms bias pulse widths. This data is for a 3 $\mu$m,>5:1 aspect ratio trench. For increasing pulse widths, a lower duty cycle is required to eliminate the notch. In line with the charging model, this suggests that the higher pulse width increases the surface charge, which in turn requires a longer off period for its reduction.

In addition to the notch reduction and charge damage reduction, pulsed rf bias has additional benefits where high levels of ion impact (energy and/or density) onto the workpiece or wafer causes any detrimental effects. There are a number of examples of these benefits in higher selectivity to mask and/or underlying materials and also in the significant reduction to the RIE lag effect.

When etching silicon (single-crystal or poly-crystal) mask materials are typically photoresist or silicon oxide and usually the underlayer is also oxide. Both of these materials have plasma etch rates which are ion energy and density dependent. The role of the ion bombardment is to break the chemical and physical bonds in either the oxide or the cross linked polymeric photoresist material. When the ion energy is below a threshold level, typically less than a few tens of eV (<20 eV), very much lower etch rates for these materials can be achieved. If the bonds in the material are not broken, it becomes harder for the chemical etching to proceed. In addition, when the ion energy is at or above the threshold value, the erosion rate can be reduced by pulsing the ions, as now the erosion will largely take place only during part of the cycle when the ions impact the surface. Generally, the lower the duty cycle, the higher the etch selectivity to these materials. FIG. 8 shows the increase in etch selectivity of etching between silicon and photoresist as the duty cycle reduces. This is for a 2.5 ms pulse width under the conditions stated in the figure. Similar results are obtained for oxide. In conclusion, this means that low frequency pulsed bias can be used to eliminate or reduce notching whilst also enabling high mask and underlayer selectivities. Pulsing here refers to the on-off repetitive switching (defined by pulse width and duty cycle) pulsing of the RF (bias) power during the "on" part of the power supply within the alternating etch/passivation cyclic process.

RIE lag is also known as Aspect Ratio Dependent Etching or ARDE. As the duty cycle is reduced, the etch rate of the silicon is observed to reduce. See FIG. 9, which presents data for 2.5 ms pulse width and for 3 to 50 $\mu$m trench widths. However, the etch rate does not decrease at the same rate for all aspect ratios. Indeed, the trend shows that at 40% duty cycle for the 2.5 ms pulse width, all of the features etch at the same rate, resulting in zero RIE lag or ARDE. The reason for this requires an understanding of the details of the cyclic etch and passivation process. During the passivation step, the protective polymer is deposited on all of the surfaces that are exposed to the plasma. But, both the thickness of the deposition in the bases of the trenches and the step coverage depend on the aspect ratio. As the aspect ratio increases, transport limitations ensure that the passivation reduces on the base of the trench. In other words, more deposition is present in the wide trenches compared to the narrow trenches. Now, this means that more passivation has to be removed in wider trenches before silicon etching can take place. So, although the etch rate in the wider features is actually still higher, the net effect of the etch and passivation (removal and deposition) is to equalize the etch rates of the narrow and wide features. This RIE lag compensation effect can be achieved by a number of ways which allow judicious balance of the etch and deposition conditions to achieve the same effect. Pulsed RF bias also demonstrates this effect. FIG. 9 shows the etch rate as a function of duty cycle at a 2.5 ms pulse width for trench widths ranging from 3 to 50 $\mu$m. The etch rate decreases as the duty cycle reduces. The rate of decrease reduces with trench width as the duty cycle reduces, until at 40% the rates are similar resulting in a zero RIE lag or ARDE.

The ion bombardment of the wafer also influences the passivation on the sidewall (a part of the step coverage). This in turn plays a key role in controlling the sidewall angle of the etched trench. Generally, increasing the passivation or reducing the passivation removal rate reduces the angle of the trench, where angles less than 90 degrees represents positive tapered trenches and angles >90 degrees represents reentrant tapered trenches. The effect of decreasing the duty cycle (of a 2.5 ms pulse) on the profile is shown in FIG. 10 for 3 $\mu$m to 50 $\mu$m trench widths. This shows that RF bias pulsing can be effectively used to precisely control the sidewall of the trench. Very similar results were obtained for a 5 ms pulse width. These trends indicate that duty cycle reduction effectively decreases the passivation removal by the ions from the sidewall of the trench.

FIG. 11 shows a circuit to pulse rf fed to a platen.

The apparatus comprises a chamber 8 having a platen 9 on which is positioned a wafer or workpiece 10. The chamber 8 also includes a dielectric window 11 surrounded by an ICP coil 12. Gas may be fed into chamber 8 through inlet 13 and may be pumped out through outlet 14. In the embodiment shown, the ICP coil 12 is connected to a matching unit 15 which in turn is connected to a CW RF power supply 16. The platen 9 is connected to a matching unit 17 which is connected to an RF power supply 18 which in turn is connected to a pulse generator 19.

A pulsed DC potential applied to a platen may be used in place of pulsed RF applied to the platen if the workpiece is sufficiently conducting, or is of a form where most of the material is conducting but a thin insulating layer may exist within the structure.

The circuit shown in FIG. 12 allows the DC potential applied to the platen to be pulsed between two values. Typically in a plasma processing apparatus the potentials may be:
1) sufficiently negative with respect to plasma potential to accelerate positive ions towards the surface of the workpiece, giving them a narrow angular distribution and adequate energy to etch the material.
2) slightly negative with respect to the plasma potential (close to floating potential) in order to form a sheath through which ions are accelerated, but to relatively low energy, so that their angular distribution is large, and they can play a significant role in negative charge cancellation.

The "on time" for the more negative bias level, and the relative length of times for which the platen is biassed to either DC potential, can be chosen as for pulsed RF bias of the platen. The smaller negative potential will generally be chosen to be close to the floating potential reached during the off period for the pulsed RF bias, but the circuit shown in FIG. 12 would allow other choices of potential and therefore ion energy and angular distribution.

In some circumstances, in place of the smaller negative potential part of the pulse cycle, a positive potential may be used in order to deliberately accelerate electrons and potentially negative ions to the workpiece to aid in the discharge mechanism, and to repel positive ions. The acceleration of electrons towards the workpiece may result in a reduction in the time required to carry out the discharge function, thereby allowing the etch part of the pulsed cycle to be increased, resulting in higher overall etch rates.

In FIG. 12, reference numerals of FIG. 11 refer to identical components, where these are present. Where FIG. 12 differs is the provision of a DC power amplifier 20 connected to platen 9. A pulse generator 21 is connected to the amplifier 20.

An alternative circuit to that shown in FIG. 12 might employ a DC power supply to provide the more negative bias potential, with a suitable electronic switch connected between it and the platen. The switch would be controlled by a pulse generator, and would either switch between closed and open states (in open state the platen potential would reach local floating potential), or would change over to allow the bias to be provided alternately by a second DC power supply.

Details of the bias options are shown in FIG. 13.

The application of pulsed DC potentials to the platen will have benefits when processing workpieces which are conducting or semiconducting. The technique may also be used for workpieces which contain thin insulating layers, such that the capacitance of the layer is large enough to make the RC time constant of the order of the repetition rate of the potential pulsing.

As an example, a wafer may consist of silicon with a thin, of order 1m thick, silicon oxide layer. On top of this layer is a further thicker layer of silicon.

Parallel plate capacitor: $C = \epsilon_o \epsilon_r A / d$ where A=plate area,
  d=distance between plates,
  $\epsilon_o$=permittivity of free space,
  $\epsilon_r$=relative permittivity.
For a 150 mm wafer A=0.0177 $m^2$ d=1×10$^{-6}$ m
  $\epsilon_o$=8.854×10$^{-12}$ F/m $\epsilon_r$=4, typical value for oxide layer, but is material specific.
Therefore C=6.3×10$^{-7}$ F
For a plasma resistance of approximately 10 Ω the RC time constant ≈6×10$^{-6}$ seconds.
To ensure that the potential on the surface exposed to the plasma follows the applied potential to a reasonable degree, pulse lengths would need to be approximately 10 μs. For a thinner insulating layer and higher capacitance, pulse lengths could increase.

This invention relates to methods of reduction of surface charge which can build up during plasma etching. As such, it is therefore also applicable to cases where charge build causes detrimental effects when etching electrically insulating substrates such as glass, quartz, sapphire, zirconia and the like. When etching these materials in a plasma discharge, detrimental effects including "pitting" damage or erosion (as shown in FIG. 15) and loss in profile anisotropy (as shown in FIG. 16) can occur as a result of surface charging. Pulsing the rf bias to reduce this surface charge directly improves the etching result by reducing both of those detrimental effects. FIG. 17 demonstrates this for a deep quartz etch where the profile anisotropy is still maintained using low frequency rf bias pulsing with a 12 ms pulse off width and a 50% duty cycle.

Process Conditions

| Parameter | FIG. 15 | FIG. 16 | FIG. 17 |
| --- | --- | --- | --- |
| Gas 1 Flow Rate, sccm | $C_3F_8$:30 | $C_3F_8$:40 | $C_3F_8$:40 |
| Gas 2 Flow Rate, sccm | | $O_2$:10 | $O_2$:10 |
| Pressure, mTorr | 3 | 4 | 4 |
| RF Coil Power, W (13.56 MHz) | 600 | 800 | 800 |
| RF Bias Power, W (13.56 MHz) | 250 | 150 | — |
| Platen Temperature, ° C. | 20 | 20 | 20 |
| Process Time, mins | 45 | 20 | 45 |
| RF Bias Power, W (380 kHz pulsed) | — | — | 150, 12 ms on 50% Duty Cycle |

What is claimed is:

1. A method of etching a feature in a substrate in a chamber, the method comprising alternately etching by means of a plasma and depositing a passivation layer by means of a plasma, wherein a bias frequency is applied to the substrate which is at or below the ion plasma frequency.

2. A method according to claim 1, wherein the bias frequency is pulsed.

3. A method of etching a feature in a substrate in a chamber, the method comprising alternately etching by means of a plasma and depositing a passivation layer by means of a plasma, wherein a pulsed bias frequency is applied to the substrate.

4. A method of etching a feature in a substrate in a chamber by means of a plasma, the method comprising applying a pulsed bias frequency to the substrate which is at or below the ion plasma frequency.

5. A method according to claim 1, wherein the bias frequency is produced by an RF or DC bias power supply.

6. A method according to claim 1, wherein the substrate is a semiconductor.

7. A method according to claim 1, wherein the substrate comprises an insulating underlayer.

8. A method according to claim 1, wherein the bias frequency is at or below 4 MHz.

9. A method according to claim 8, wherein the bias frequency is in the range of 50 kHz to 380 kHz.

10. A method according to claim 1, further comprising an etching and passivation step which is carried out at a higher pressure than the etching or alternate etching and deposition step.

11. A method according to claim 10, wherein the etching and passivation step carried out at a higher pressure is started when the underlayer is approached.

12. A method according to claim 10, further comprising an end-point detection step to determine when to switch from the etching or alternate etching and deposition first step to the further etching and passivating step.

13. A method according to any one of claim 2, wherein the pulse off time is greater than 100 μs.

14. A method according to claim 2, wherein the pulse off time is applied for between 10% to 90% of the time.

15. A method according to claim 1, further comprising the step of providing a magnetic filter to partially or completely divide the volume of the chamber in which the plasma is formed from the volume in which the substrate is positioned.

16. An apparatus for etching a feature in a substrate, the apparatus comprising a chamber, means for alternately etching the substrate by means of a plasma and depositing a passivation layer by means of a plasma, and means for providing a bias frequency to the substrate which is at or below the ion plasma frequency.

17. An apparatus for etching a feature in a substrate, the apparatus comprising a chamber, means for alternately etching the substrate by means of a plasma and depositing a passivation layer by means of a plasma, and means for providing a pulsed bias frequency to the substrate.

18. An apparatus for etching a feature in a substrate, the apparatus comprising a chamber, means for etching the substrate by means of a plasma and means for providing a pulsed bias frequency to the substrate which is at or below the ion plasma frequency.

19. A method according to claim 11, further comprising an end-point detection step to determine when to switch from the etching or alternate etching and depositing first step to the further etching and passivating step.

* * * * *